(12) United States Patent
Tu et al.

(10) Patent No.: US 8,093,674 B2
(45) Date of Patent: Jan. 10, 2012

(54) MANUFACTURING METHOD FOR MOLDING IMAGE SENSOR PACKAGE STRUCTURE AND IMAGE SENSOR PACKAGE STRUCTURE THEREOF

(75) Inventors: Hsiu-Wen Tu, Chu-Pei (TW);
Ren-Long Kuo, Chu-Pei (TW);
Young-Houng Shiao, Chu-Pei (TW);
Tsao-Pin Chen, Chu-Pei (TW);
Mon-Nan Ho, Chu-Pei (TW);
Chih-Cheng Hsu, Chu-Pei (TW);
Chin-Fu Lin, Chu-Pei (TW);
Chung-Hsien Hsin, Chu-Pei (TW)

(73) Assignee: Kingpak Technology, Inc., Hsin-Chu Hsien (TW)

( * ) Notice: Subject to any disclaimer, the term of this patent is extended or adjusted under 35 U.S.C. 154(b) by 141 days.

(21) Appl. No.: 12/603,591

(22) Filed: Oct. 22, 2009

(65) Prior Publication Data

US 2011/0024861 A1 Feb. 3, 2011

Related U.S. Application Data

(60) Provisional application No. 61/229,404, filed on Jul. 29, 2009.

(51) Int. Cl.
*H01L 31/02* (2006.01)
(52) U.S. Cl. ... 257/434; 257/433; 257/432; 257/E31.11; 438/64; 438/48; 438/65

(58) Field of Classification Search .......... 257/433, 257/434, 432, 435, 704, E31.11, E21.499; 438/48, 64, 65
See application file for complete search history.

(56) References Cited

U.S. PATENT DOCUMENTS

| | | | |
|---|---|---|---|
| 6,266,197 B1 * | 7/2001 | Glenn et al. | 359/819 |
| 6,492,699 B1 * | 12/2002 | Glenn et al. | 257/433 |
| 7,059,040 B1 * | 6/2006 | Webster et al. | 29/831 |
| 7,199,438 B2 * | 4/2007 | Appelt et al. | 257/433 |
| 7,312,106 B2 | 12/2007 | Raben | |

* cited by examiner

*Primary Examiner* — Thinh T Nguyen
(74) *Attorney, Agent, or Firm* — Stites & Harbison PLLC; Juan Carlos A. Marquez, Esq.

(57) ABSTRACT

A manufacturing method for molding an image sensor package structure and the image sensor package structure thereof are disclosed. The manufacturing method includes following steps of providing a half-finished image sensor for packaging, arranging a dam on the peripheral of a transparent lid of the half-finished image sensor, positioning the half-finished image sensor within a mold, and injecting a mold compound into the mold cavity of the mold. The dam is arranged on the top surface of the transparent lid and the inner surface of the mold can exactly contact with the top surface of dam so that the mold compound injected into the mold cavity is prevented from overflowing to the transparent lid by the dam. Furthermore, the arrangement of the dam and the mold compound can increase packaged areas and extend blockage to invasive moisture so as to enhance the reliability of the image sensor package structure.

11 Claims, 11 Drawing Sheets

MANUFACTURING METHOD FOR MOLDING IMAGE SENSOR PACKAGE STRUCTURE AND IMAGE SENSOR PACKAGE STRUCTURE THEREOF

BACKGROUND OF THE INVENTION

1. Technical Field

The present invention relates to semiconductor packaging structures. More particularly, the present invention relates to a manufacturing method for molding image sensor package structure and an image sensor package structure made through the method.

2. Description of Related Art

Conventionally, an image sensor package is made by placing an image sensor chip on a substrate, connecting the image sensor chip and the substrate by means of metal conducting wires, and mounting a transparent lid (e.g. glass) upon the image sensor chip so as to allow light to pass through the transparent lid and get acquired by the sensor chip. The resultant image sensor package is for a system manufacturer to integrate to an external device, such as a printed circuit board, or to apply to any of various electronic products such as a DSC (Digital Still Camera), a DV (Digital Video), a security monitoring system, a mobile phone, or a vehicle image sensing module.

In traditional image sensor package, the transparent lid is adhered beforehand to the image sensor chip for protecting the chip against foreign pollutant particles. After the transparent lid is installed, the metal conducting wires are arranged so as to electrically connect the image sensor chip with the substrate or a carrier. Then, a macromolecular liquid compound is used to cover the metal conducting wires. However, the macromolecular liquid compound is quite costly and needs to be arranged through a time-consuming dispensing process. Consequently, the traditional technology of such image sensor package is disadvantageous in its prolonged processing cycle and high cost.

In addressing the above problems, U.S. Pat. No. 7,312,106 has proposed a method for encapsulating a chip having a sensitive surface. The known method comprises mounting a chip having a sensitive chip surface and contact pads on a carrier having carrier contact pads; bonding the chip contact pads to the carrier contact pads; applying a closed dam around the sensitive chip surface, which defines an open space inside the dam; positioning a lid, which closes the open space inside the dam; positioning the chip and the carrier into a mould; introducing package material into the mould for transfer molding; and conducting a post mold cure process so as to complete encapsulation of the chip.

The upper half of the mould could have an inward-extending section facing the sensitive chip surface so as to facilitate the package material in fully covering around the lid without covering the central upper surface of the lid, thereby protecting the periphery of the lid. However, the inward-extending section could significantly increase the cost for making the upper mould half, and is unfavorable to the purpose of reducing the overall cost of the image sensor package. Although the prior art method might also be accomplished by using a different upper mould half without the inward-extending section, it otherwise requires an additional elastic material settled between the upper mould half and the lid so as to protect the lid from the pressure exerted by the direct application of the upper mould. Even when the elastic material is used, the known method for encapsulating a chip still puts the image sensor in risk from damage, thus leading to a decreased yield rate.

SUMMARY OF THE INVENTION

The present invention provides a manufacturing method for molding image sensor package structure and an image sensor package structure made through the method, wherein by virtue of a dam arranged on a transparent lid, the transparent lid is free from being directly pressed by a mold, thus leading to an improved yield rate.

The present invention provides a manufacturing method for molding image sensor package structure and an image sensor package structure made through the method, wherein by virtue of a dam arranged on a transparent lid, a mold compound is allowed to cover around the chip, the transparent lid and the dam, thereby extending of the blockage to invasive moisture.

The present invention provides a manufacturing method for molding image sensor package structure and an image sensor package structure made through the method, wherein by virtue of a dam that facilitates extending blockage to invasive moisture, the reliability of the image sensor package structure is improved.

The present invention provides a manufacturing method for molding image sensor package structure and an image sensor package structure made through the method, wherein the image sensor package structure is produced by means of molding so as to significantly shorten processing cycle time and increase throughput.

The present invention provides a manufacturing method for molding image sensor package structure and an image sensor package structure made through the method, wherein batch-type production of the image sensor package structure is achieved by means of molding so as to reduce processing costs.

The present invention provides a manufacturing method for molding image sensor package structure and an image sensor package structure made through the method, wherein the disadvantages of the known technology related to the costly liquid compound and the time-consuming dispensing process are eliminated.

To achieve the aforementioned effects, the manufacturing method for molding image sensor package structure of the present invention includes the following steps: providing a half-finished image sensor for packaging, wherein the half-finished image sensor has a substrate including a carrying surface provided with a plurality of first conductive contacts; at least one chip including a first surface, a second surface, and a plurality of second conductive contacts, wherein the first surface is coupled to the carrying surface and the second surface has a sensitization area peripherally surrounded by the second conductive contacts that are electrically connected with the first conductive contacts; and at least one transparent lid settled on the second surface and covering over the sensitization area to define an air cavity over the sensitization area; arranging a dam extending along the upper periphery of the transparent lid; positioning the half-finished image sensor within a mold, wherein the mold includes an upper mold half contacting the upper surface of the dam and a lower mold half contacting the lower surface of the substrate, wherein a mold cavity between the upper mold half and the lower mold half is defined; injecting a mold compound into the mold cavity; and molding the image sensor package structure, opening the mold, and conducting a post mold cure process.

To achieve the aforementioned effects, the image sensor package structure of the present invention includes a substrate having a carrying surface provided with a plurality of first conductive contacts; a chip with a first surface coupled to the carrying surface, a second surface having a sensitization area and a plurality of second conductive contacts surrounding the sensitization area peripherally and electrically connected with the first conductive contacts; a transparent lid settled on the second surface and covering over the sensitization area to define an air cavity over the sensitization area; a dam extending along the upper periphery of the transparent lid; and a mold compound covering around the chip, the transparent lid and the dam at peripheries thereof.

By implementing the present invention, at least the following progressive effects can be achieved:

1. By virtue of the dam arranged on the transparent lid, the transparent lid is free from being directly pressed and damaged by the mold, thus leading to an improved yield rate of the image sensor package structure.

2. By virtue of the dam arranged on the transparent lid, there is no need to make the mold with a custom-made inward-extending section for varying lid dimensions, which significantly reduces costs for preparing the mold.

3. The dam on the transparent lid allows the mold compound to cover around the chip, the transparent lid, and the dam, thereby extending the blockage to invasive moisture.

4. The existence of the dam allows the mold to depress against the top of the dam and allows the mold compound protect the periphery of the transparent lid to prevent moisture from invading the air cavity underneath the transparent lid, thereby improving the reliability of the image sensor package structure.

5. The image sensor package structure is produced by means of molding so as to significantly shorten processing cycle time and increase throughput.

6. The molding formation and batch-type production of the image sensor package structure facilitate the reduction of the processing costs of the image sensor package structure.

7. The disadvantages of the known technology related to the costly liquid compound and the time-consuming dispensing process are eliminated.

BRIEF DESCRIPTION OF THE DRAWINGS

The invention as well as a preferred mode of use, further objectives and advantages thereof will be best understood by reference to the following detailed description of illustrative embodiments when read in conjunction with the accompanying drawings, wherein.

DETAILED DESCRIPTION OF THE PREFERRED EMBODIMENTS

Figure 1:
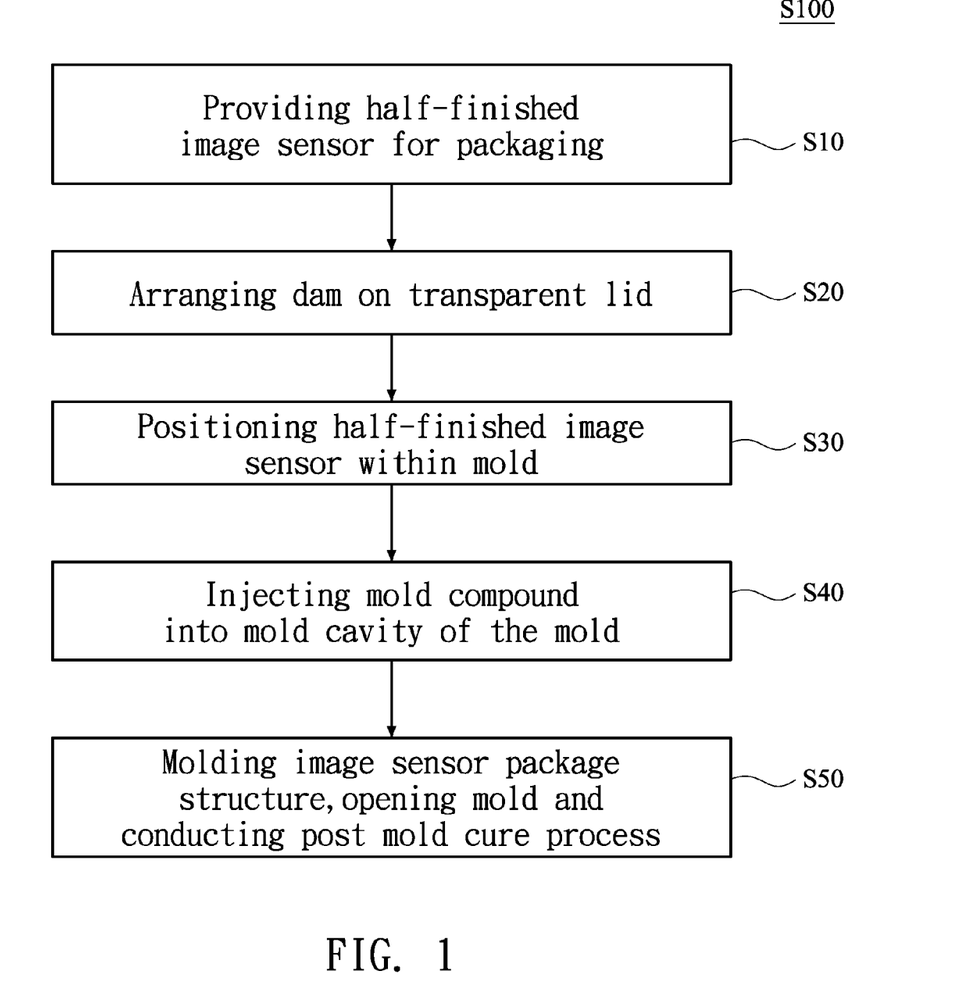
FIG. 1 is a flowchart of a first embodiment of a method for molding an image sensor package structure according to the present invention.

Referring to FIG. 1, the present embodiment is a method (S100) for molding an image sensor package structure. The method (S100) includes the following steps: providing a half-finished image sensor for packaging (S10); arranging a dam on a transparent lid (S20); positioning the half-finished image sensor within a mold (S30); injecting a mold compound into the mold cavity of the mold (S40); and molding the image sensor package structure, opening the mold and conducting a post mold cure process (S50).

Figure 2:
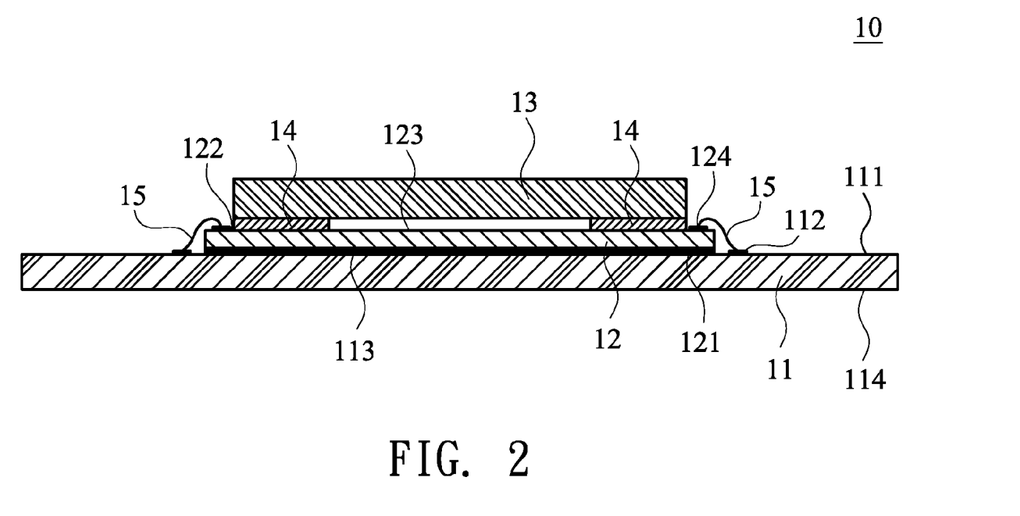
FIG. 2 is a schematic structural drawing of a half-finished image sensor for packaging according to the present invention.
Figure 5A:
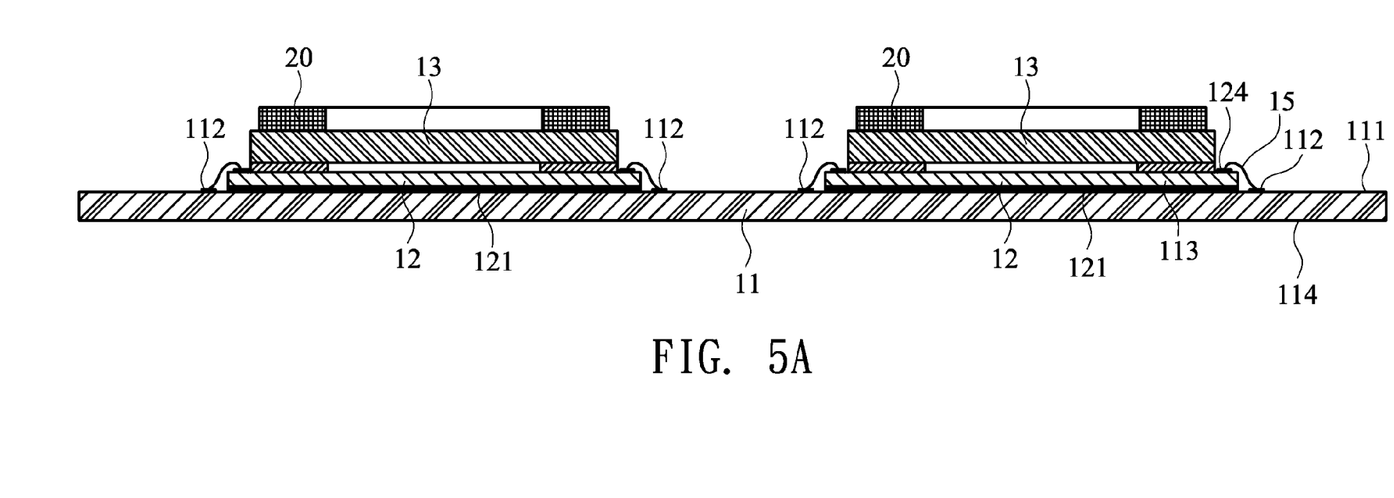
FIG. 5A, according to a second embodiment of the present invention, shows the half-finished image sensors for packaging provided with dams.

In the step of providing a half-finished image sensor for packaging (S10), as shown in FIG. 2, a half-finished image sensor 10 for packaging is provided. The half-finished image sensor 10 has a substrate 11, at least one chip 12, and at least one transparent lid 13. Alternatively, as shown in 5A, multiple said chips 12 are provided on the same substrate 11 for producing multiple said image sensor package structures simultaneously.

The substrate 11 may be one conventionally used in a normal image sensor, and may be a circuit substrate. The substrate 11 has a carrying surface 111 for carrying the chip 12. In addition, a plurality of first conductive contacts 112 is formed on the carrying surface 111, as shown in FIG. 3B.

The chip 12 has a first surface 121 coupled to the carrying surface 111 of the substrate 11 so that the chip 12 is mounted on the substrate 11. Furthermore, a glue layer 113 may be provided between the chip 12 and the substrate 11 for adhering the chip 12 onto the substrate 11. The chip 12 may be a CMOS (Complementary Metal Oxide Semiconductor) image sensing chip or a CCD (Charge Coupled Device) for sensing light. In addition, the chip 12 has a plurality of photosensitive elements and a plurality of second conductive contacts 124, as can be seen in FIG. 3B. Therein, the photosensitive elements are settled on a second surface 122 of the chip 12 so as to form a sensitization area 123. The second conductive contacts 124 are arranged to surround the sensitization area 123 and are electrically connected with the photosensitive elements. Moreover, the second conductive contacts 124 on the chip 12 and the first conductive contacts 112 on the substrate 11 may be electrically connected with each other through metal conducting wires 15 formed by wiring. The first surface 121 of the chip 12 refers to the lower surface of the chip 12 while the second surface 122 of the chip 12 refers to the upper surface of the chip 12.

The transparent lid 13 serves to protect the sensitization area 123 on the chip 12 against contaminants while allowing light to pass therethrough and enter into the sensitization area 123 of the chip 12. An adhesive layer 14 attaches the transparent lid 13 to the second surface 122 of the chip 12 so that the transparent lid 13 covers over the sensitization area 123 and so that an air cavity is defined between the transparent lid 13 and the chip 12. The adhesive layer 14 may be made of epoxy resin. Since the adhesive layer 14 is sandwiched between the sensitization area 123 and the second conductive contacts 124, it does not overlap with the sensitization area 123, and thus the chip 12 is ensured with the optimal light-sensing effect.

Figure 3A:
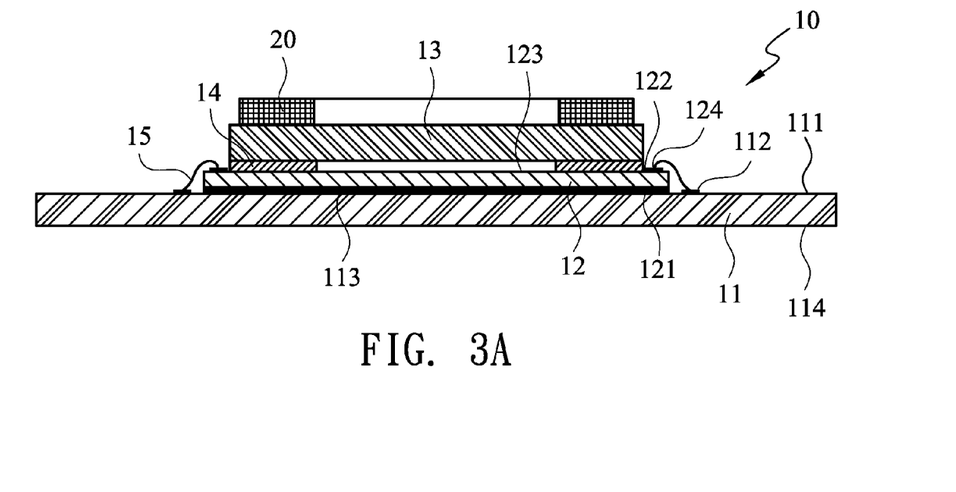
FIG. 3A, according to a first embodiment of the present invention, shows the half-finished image sensor for packaging provided with a dam.
Figure 3B:
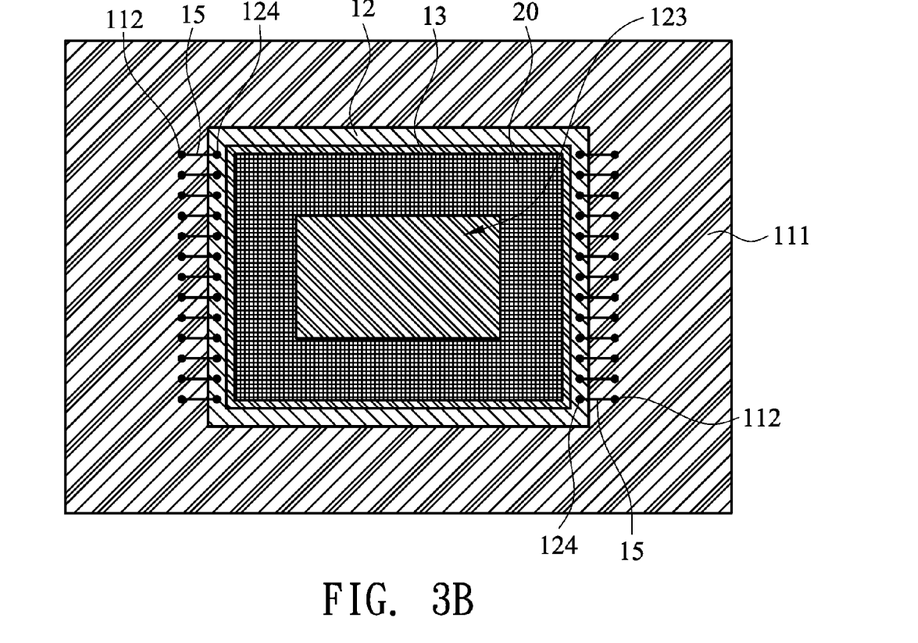
FIG. 3B is a top view of the half-finished image sensor of FIG. 3A.

In the step of arranging a dam on a transparent lid (S20), referring to FIGS. 3A and 5A, a dam 20 is set on the transparent lid 13 in such a way that it extends along an upper periphery of the transparent lid 13 while keeping away from the sensitization area 123 of the chip 12, as shown in FIG. 3B. Thereby, light is still allowed to pass through the transparent lid 13 and enter into the sensitization area 123 of the chip 12 without any complications. The dam 20 may be made of epoxy resin or a film. The epoxy resin or film are prearranged at a predetermined location and treated with ultraviolet or baked to a semi-cured state for being properly elastic and then receives a post mold cure process to become completely cured.

Figure 4A:
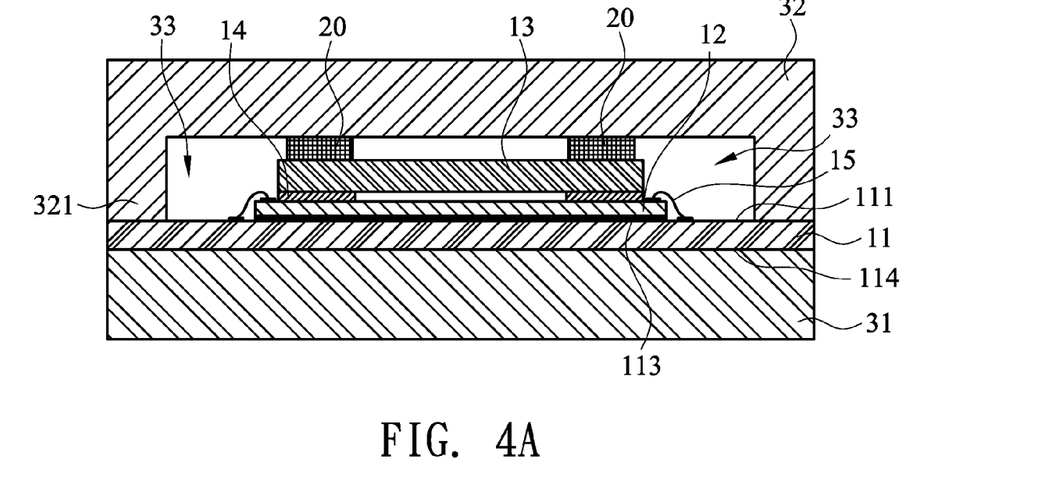
FIG. 4A, according to the first embodiment of the present invention, shows the half-finished image sensor having the dam enclosed by a mold.
Figure 5B:
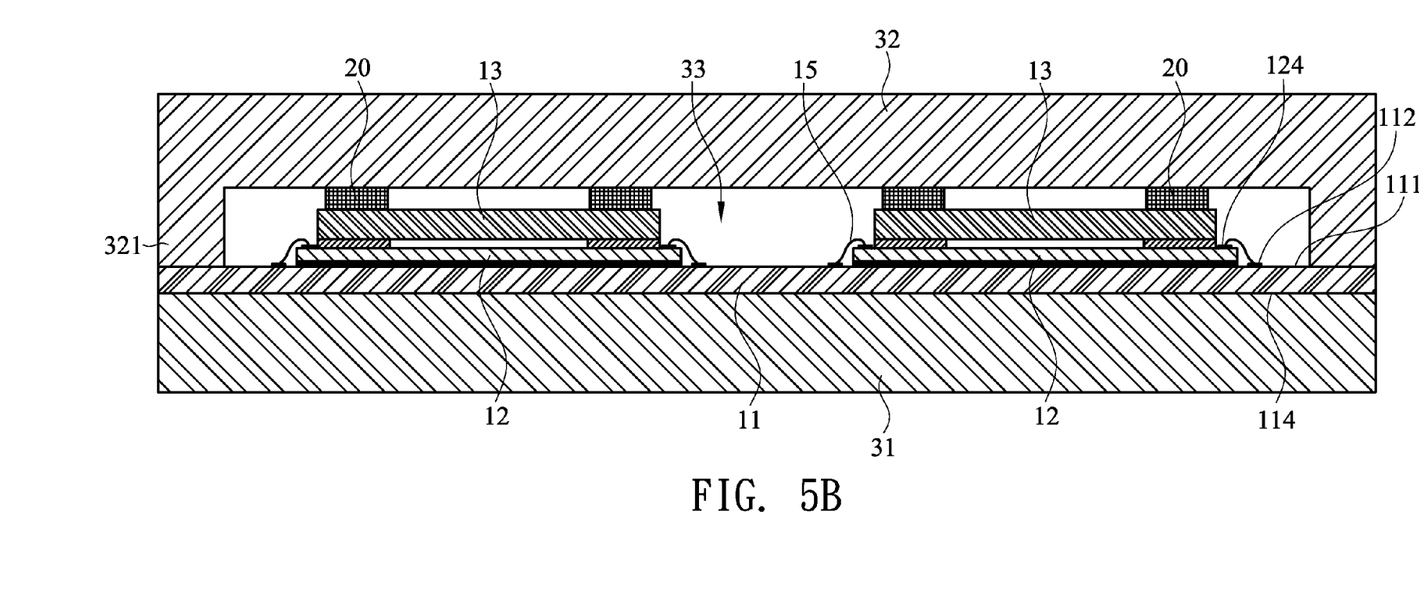
FIG. 5B, according to the second embodiment of the present invention, shows the half-finished image sensors having the dams enclosed by a mold.

In the step of positioning the half-finished image sensor within a mold (S30), referring to FIGS. 4A and 5B, the mold comprises a lower mold half 31 and an upper mold half 32. Therein the lower mold half 31 is settled at the lower surface 114 of the substrate 11 and contacts the lower surface 114 of the substrate 11, while the upper mold half 32 has its lateral wall 321 mounted on the upper surface of the substrate 11 so that the substrate 11 has its carrying surface 111 and lower surface 114 sandwiched between the upper mold half 32 and the lower mold half 31. Additionally, the upper mold half 32 has a planar inner upper surface for contacting the upper surface of the dam 20 so as to define a mold cavity 33 between the upper mold half 32 and the lower mold half 31.

Figure 4B:
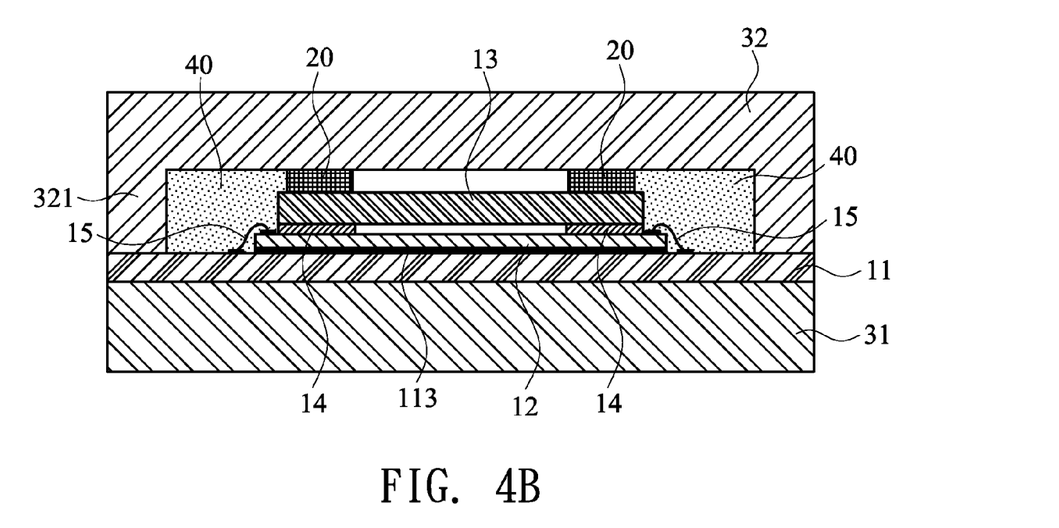
FIG. 4B, according to the first embodiment of the present invention, shows injection of a mold compound into a mold cavity of the mold.
Figure 5C:
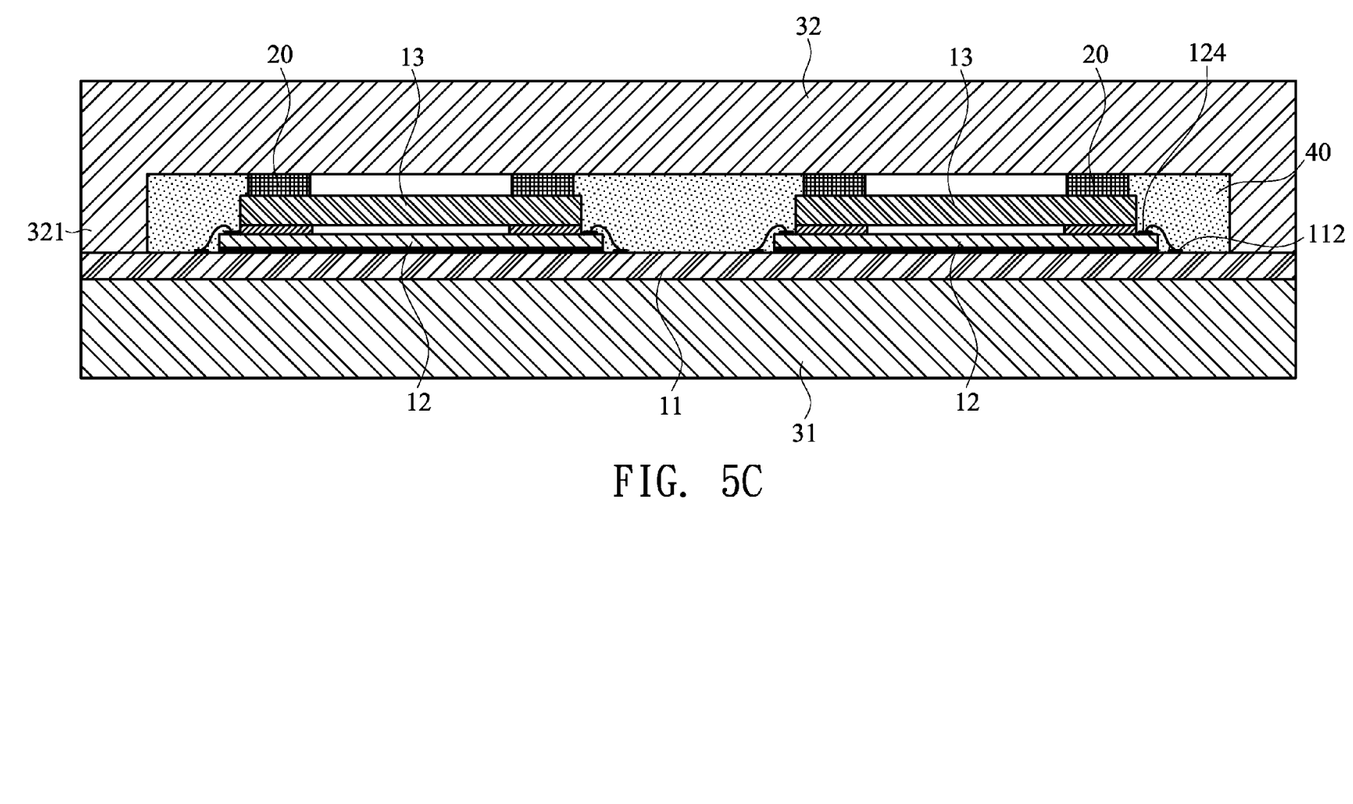
FIG. 5C, according to the second embodiment of the present invention, shows injection of a mold compound into a mold cavity of the mold.

In the step of injecting a mold compound into the mold cavity of the mold (S40), as shown in FIGS. 4B and 5C, the mold compound 40 is injected into the mold cavity 33 formed between the upper mold half 32 and the lower mold half 31 so that the mold compound 40 encapsulates the metal conducting wires 15 therein and covers around the chip 12, the transparent lid 13 and the dam 20 at peripheries thereof. Since the dam 20 acts as a barricade between the transparent lid 13 and the upper mold half 32, the mold compound 40 is blocked outside the transparent lid 13 from overflowing into the central region of the transparent lid 13. Furthermore, the upper mold half 32 directly presses upon the dam 20 so as not to directly contact the transparent lid 13, thereby protecting the transparent lid 13 from damage or surface contamination.

Figure 4C:
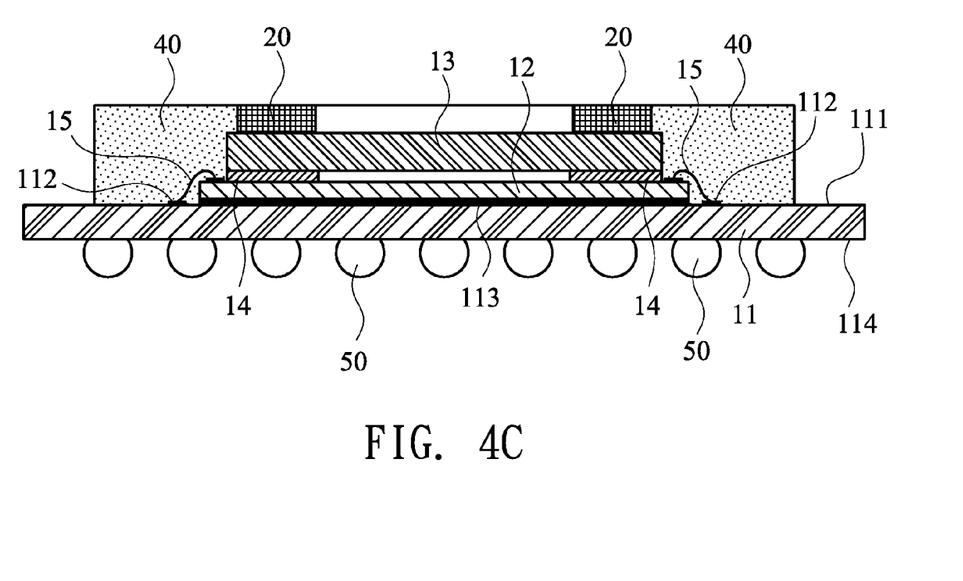
FIG. 4C, according to the first embodiment of the present invention, shows the resultant image sensor package structure after the mold is opened.

In the step of molding the image sensor package structure, opening the mold and conducting the post mold cure process (S50), the upper mold half 32 and the lower mold half 31 help the mold compound 40 to undergo transfer molding. After the mold is opened, a post mold cure process is conducted as to produce an image sensor package structure as shown in FIG. 4C. During the progress of post mold cure, the dam 20 also becomes completely cured.

Figure 5D:
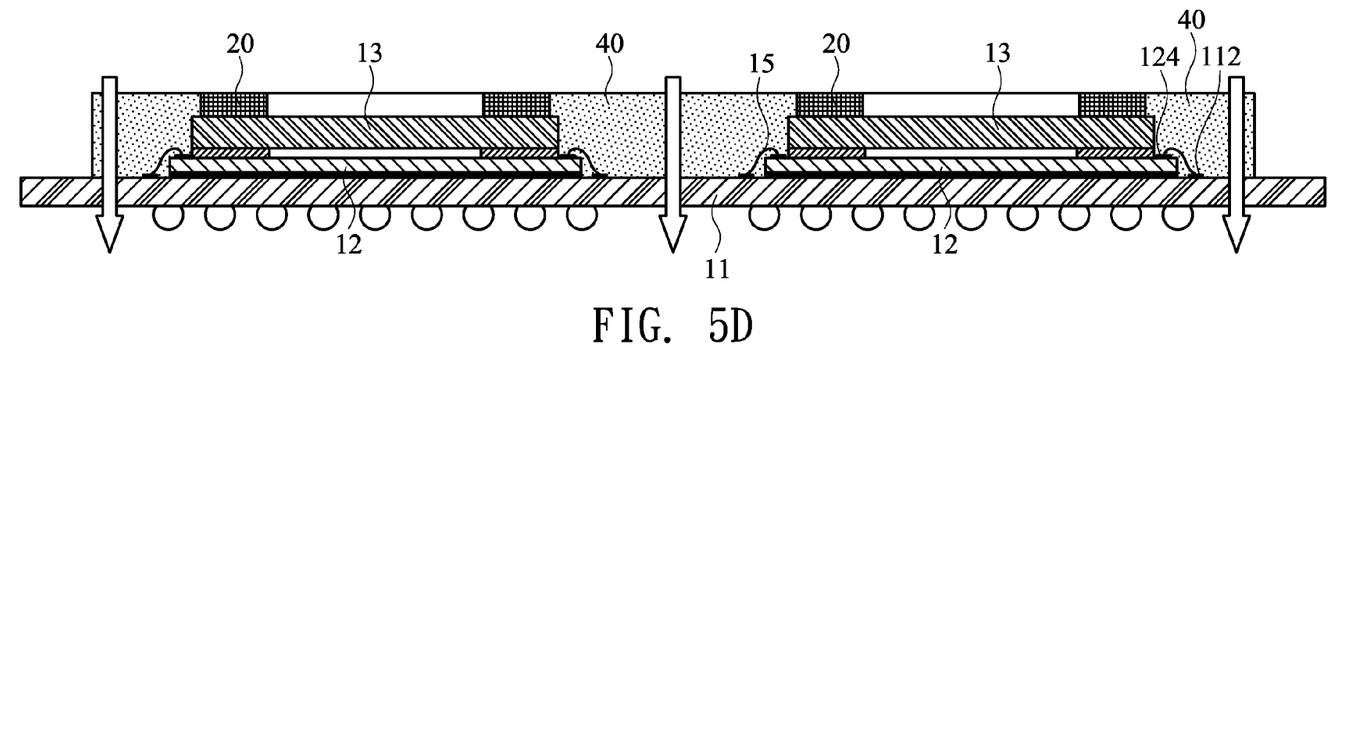
FIG. 5D, according to the second embodiment of the present invention, shows the resultant image sensor package structure after the mold of FIG. 5C is opened.

The disclosed method may further include a step of placing solder balls. Referring to FIGS. 4C and 5D, solder balls 50 may be attached to the lower surface 114 of the substrate 11. The solder balls 50 are also electrically connected to the first conductive contacts 112 on the carrying surface 111 by way of the circuit structure of the substrate 11, which allows the image sensor package structure to electrically connect with external circuit devices.

Since the mold compound 40 is more inexpensive than the conventionally used liquid compound, substitution of liquid compound with the mold compound 40 helps to significantly reduce material costs for packaging. Furthermore, coating of the conventionally used liquid compound requires the known dispensing process that prolongs the processing cycle. On the other hand, the transfer molding process of the mold compound 40 achieves the purpose of forming in a significantly reduced cycle time, thereby improving throughput and in turn lowering the overall manufacturing costs. Moreover, the dam 20 additionally mounted on the transparent lid 13 serves as a mount for the mold compound to seal off the transparent lid and prevent invasive moisture from seeping into the chip 12, thereby vastly improving the reliability of the image sensor package structure.

Figure 5E:
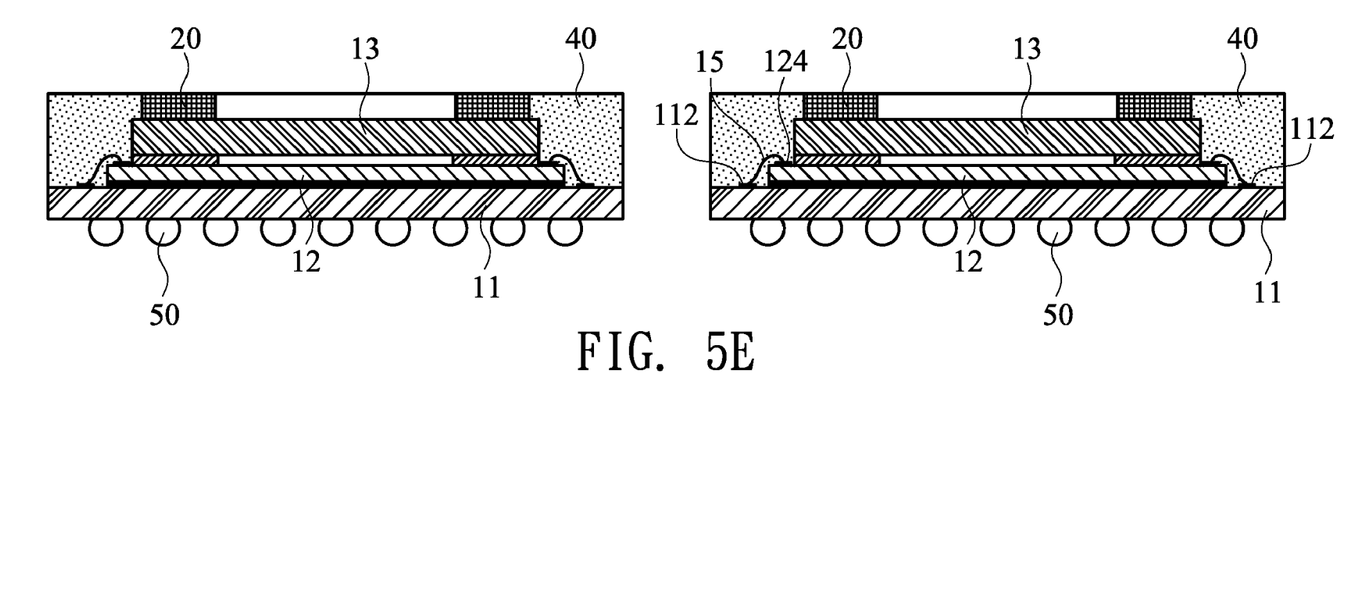
FIG. 5E, according to the second embodiment of the present invention, shows the package structure of FIG. 5D cut into individuals.

Furthermore, as shown in FIGS. 5A through 5E, the above method (S100) for molding the image sensor package structure may be applied to producing multiple said image sensor package structure at the same time. In this alternative application, the substrate 11 carrying multiple said chips 12 is positioned within a mold, as shown in FIG. 5B. The mold compound 40 is injected into the mold cavity 33 of the mold, as shown in FIG. 5C, so that the mold compound 40 later undergoes transfer molding, mold opening and the post mold cure process. Additionally, placement of solder balls 50 may be conducted after the post mold cure. The solder balls 50 may be electrically connected to the first conductive contacts 112 on the carrying surface 111 by way of the circuit structure of the substrate 11 so that the solder balls 50 allow the image sensor package structure to electrically connect with external circuit devices. At last, as illustrated by FIGS. 5D and 5E, the finished image sensor package structure, after the post mold cure and placement of the solder balls 50, may be cut by means of any existing cutting technology to become plural image sensor package structures, as package individuals, so as to improve efficiency of the throughput.

Figure 6A:
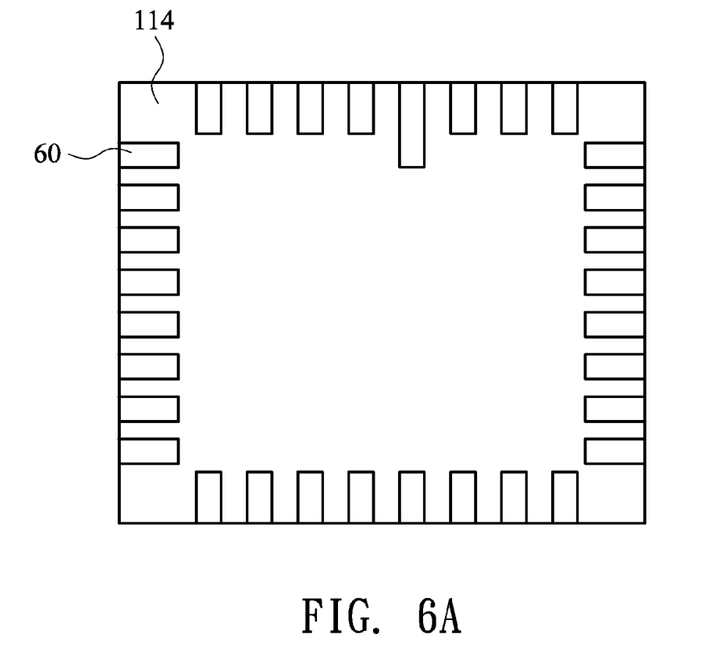
FIG. 6A, according to a first concept of the present invention, shows soldering pads arranged on a lower surface of the substrate.
Figure 6B:
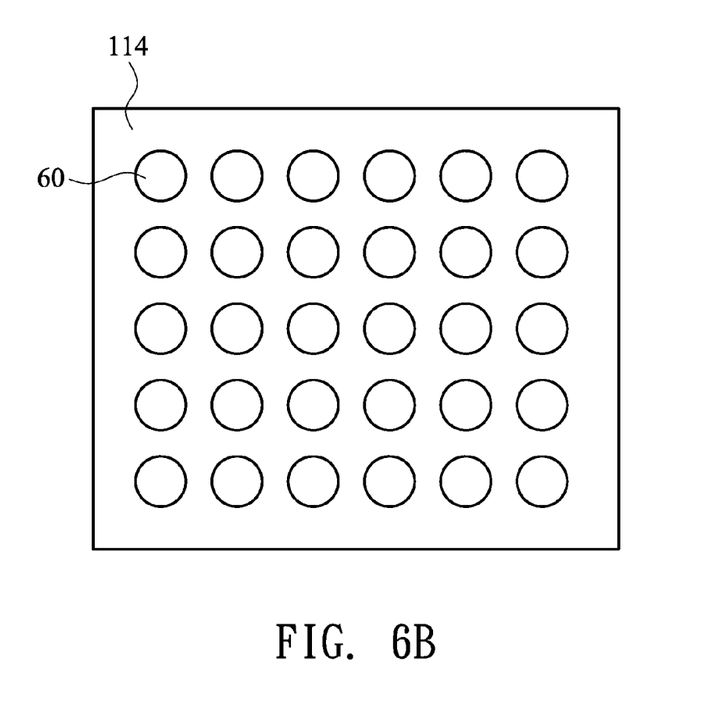
FIG. 6B, according to a second concept of the present invention, shows soldering pads arranged on the lower surface of the substrate.

Referring to FIGS. 6A and 6B, in addition to the solder balls 50, soldering pads 60 may be arranged on the lower surface 114 of the substrate 11. The soldering pads 60 are electrically connected to the first conductive contacts 112 of the circuit structure of the substrate 11 so that the soldering pads 60 allow the image sensor package structure to electrically connect with external circuit devices. Preferably, the soldering pads 60 may be arranged along the lower periphery of the lower surface 114, as shown in FIG. 6A, or may be arranged into an array, as shown in FIG. 6B.

The molded image sensor package structure is thus suitable for vehicle image sensors to give the advantage of effectively blocking moisture invasion.

The embodiments described above are intended only to demonstrate the technical concept and features of the present invention so as to enable a person skilled in the art to understand and implement the contents disclosed herein. It is understood that the disclosed embodiments are not to limit the scope of the present invention. Therefore, all equivalent changes or modifications based on the concept of the present invention should be encompassed by the appended claims.

What is claimed is:

1. An image sensor package structure, comprising:
   a substrate including a carrying surface provided with a plurality of first conductive contacts;
   a chip including a first surface coupled to the carrying surface, a second surface having a sensitization area, and a plurality of second conductive contacts surrounding the sensitization area and electrically connected with the first conductive contacts;

a transparent lid directly adhered to the second surface and covering over the sensitization area to define an air cavity over the sensitization area;

a dam directly applied onto an upper surface of the transparent lid and extending along a periphery of the upper surface of the transparent lid; and a mold compound covering around the chip, the transparent lid, and the dam at peripheries thereof, wherein a top surface of the mold compound and a top surface of the dam are at the same level.

2. The image sensor package structure of claim 1, wherein the substrate is a circuit substrate.

3. The image sensor package structure of claim 1, wherein the chip is a CMOS (Complementary Metal Oxide Semiconductor) image sensing chip or a CCD (Charge Coupled Device).

4. The image sensor package structure of claim 1, wherein the second conductive contacts and the first conductive contacts are electrically connected with each other through metal conducting wires formed by wiring.

5. The image sensor package structure of claim 1, wherein the sensitization area is constructed from a plurality of photosensitive elements.

6. The image sensor package structure of claim 1, wherein the transparent lid adheres to the second surface through an adhesive layer.

7. The image sensor package structure of claim 6, wherein the adhesive layer is made of epoxy resin.

8. The image sensor package structure of claim 1, wherein the dam is made of epoxy resin or is a film.

9. The image sensor package structure of claim 1, further comprising a plurality of solder balls, wherein the solder balls are attached to a lower surface of the substrate and electrically connected to the first conductive contacts through a circuit structure of the substrate.

10. The image sensor package structure of claim 1, further comprising a plurality of soldering pads, wherein the soldering pads are attached to the lower surface of the substrate and electrically connected to the first conductive contacts through a circuit structure of the substrate.

11. The image sensor package structure of claim 10, wherein the soldering pads are arranged along a lower periphery of the substrate or are arranged into an array at the lower surface of the substrate.

* * * * *